(12) United States Patent
Andberg et al.

(10) Patent No.: US 7,460,371 B2
(45) Date of Patent: Dec. 2, 2008

(54) WIFFLE TREE COMPONENTS, COOLING SYSTEMS, AND METHODS OF ATTACHING A PRINTED CIRCUIT BOARD TO A HEAT SINK

(75) Inventors: John William Andberg, Santa Cruz, CA (US); Romi Mayder, San Jose, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 105 days.

(21) Appl. No.: 11/440,955

(22) Filed: May 25, 2006

(65) Prior Publication Data

US 2007/0274052 A1 Nov. 29, 2007

(51) Int. Cl.
*H05K 7/20* (2006.01)
(52) U.S. Cl. .................. 361/704; 361/707; 361/718; 361/719; 257/718; 257/719; 165/80.2
(58) Field of Classification Search ............ None
See application file for complete search history.

(56) References Cited

U.S. PATENT DOCUMENTS

| | | | | |
|---|---|---|---|---|
| 4,923,179 A | * | 5/1990 | Mikolajczak | 267/160 |
| 5,552,961 A | * | 9/1996 | Van Gaal et al. | 361/700 |
| 6,388,189 B1 | * | 5/2002 | Onoue | 174/383 |
| 6,714,414 B1 | * | 3/2004 | Dubovsky et al. | 361/704 |
| 6,809,930 B2 | * | 10/2004 | Mueller et al. | 361/704 |
| 7,170,750 B2 | * | 1/2007 | Tanaka | 361/719 |

* cited by examiner

*Primary Examiner*—Boris L Chervinsky

(57) ABSTRACT

In one embodiment, there is disclosed apparatus having a printed circuit board (PCB); a heat sink device for disposition adjacent the bottom surface of the PCB; at least one wiffle tree component disposed adjacent the top surface of the PCB, having a base portion with a plurality of legs extending therefrom; and at least one mechanism to generate a clamping force between the at least one wiffle tree and the top surface of the PCB, and between the bottom surface of the PCB and the heat sink. There is disclosed a method of attaching a printed circuit board (PCB) to a heat sink. In an embodiment, the method includes providing at least one wiffle tree component; disposing one of the at least one wiffle tree component adjacent to the PCB; and securing the one of the at least one wiffle tree component with a fastener. Other embodiments are also disclosed.

26 Claims, 11 Drawing Sheets

WIFFLE TREE COMPONENTS, COOLING SYSTEMS, AND METHODS OF ATTACHING A PRINTED CIRCUIT BOARD TO A HEAT SINK

BACKGROUND

As test electronics achieve ever-greater speeds and densities, one significant problem is the removal of the internal heat generated by the tester. In prior generations of automated test equipment, air cooling was sufficient. However, as speeds increased, signal path length has become a critical issue. Minimizing path length has led to miniaturization by a factor of over 1000 in the last 5 years, to the extent that it is no longer practical to air cool current generation automated test equipment. Greater speed compounds the problem, as the heat generation increases with clock speed. Furthermore, customers are demanding higher pin count testers, which increases the difficulty of total power dissipation in the tester.

All of these factors have made liquid cooling more necessary for heat removal from modern test electronics. The current generation of testers must remove about 20 kW of heat from a volume of less than 10 cubic feet. In general, the most reliable methods of liquid cooling seek to isolate the cooling fluid from the electronics of the tester, as opposed to immersion cooling. This is accomplished using various types of heat sink devices, e.g. waterblocks which (sometimes are referred to as 'cold plates'). The active circuitry may be mounted to a PC board, which in turn may be mounted to a waterblock.

In many machines, circuits are mounted to both sides of a waterblock. This configuration may be used to either minimize space or more fully utilize an expensive component, i.e. the waterblock. In general, the working fluid may be water or some other liquid. Water has the highest cooling performance of the common chosen working fluids, but a variety of considerations may preclude its use.

In general, these waterblocks may be constructed of an easily machined metal with high thermal conductivity. Typically, this metal is either aluminum or copper. Water, or another fluid, may be routed through passages in the metal so as to remove heat. The attachment of the dissipating components to the heat sink, which may be a waterblock. In testers, there may be components attached to the PCB that dissipate a relatively large amount of power over a small area. Other circuit boards may have a multitude of small components that dissipate low amounts of power. The latter configuration may be easily cooled by attachment of the PCBs to the waterblock by a few screws. Due to the relatively low heat dissipation requirements, conduction to the waterblock is effective even with the low average contact pressure exerted by the screws on the board. However, boards with high local heat fluxes pose a challenge. On these boards, certain packages have dissipations of 3-4 W over a 7×7 mm area, or heat fluxes approaching 10 W/cm². Such high heat fluxes critically require the performance of each part of the system.

Referring to FIG. 1, thermal performance of a system 100 may be analyzed as a function of performance of its parts. Significant thermal resistances for system 100 generally exist from a silicon junction of die 105 to an integrated circuit (IC) case or package 110; significant thermal resistances may exist from case 110 to a top portion 115 of a PCB 120; significant thermal resistances may exist from top portion 115 to a bottom portion 125 of PCB 120; significant thermal resistances may exist from bottom 125 of PCB 120 to a waterblock 130, and significant thermal resistances may exist from waterblock 130 to flowing fluid 135.

A thermal interface material 140 may be used between PCB 120 and waterblock 130. Thermal interface material 140 is provided to achieve good thermal contact between the two rigid surfaces. Generally, the thermal resistance of PCB 120 and the thermal resistance of thermal interface material 140 are the most significant to the overall system. It is the resistance of PCB 120 to waterblock 130 through thermal interface or pad 140 that is the weakest link to achieve efficient cooling in system 100. Although the resistance within PCB 120 is normally greater, that resistance is due to the makeup of PCB 120, and so has little variation from unit to unit.

The resistance from PCB 120 to waterblock 130 is influenced by many factors. The most important factor is the contact pressure of PCB 120 against thermal interface material 140 and waterblock 130. This local contact pressure may vary from several hundred PSI in the immediate vicinity of a screw to less than 10 PSI an inch or more away from a screw. This creates a conflict with screw placement. With more screws, there is better local heat transfer. However, more screws are worse for routing signals through the board. Each screw and its associated keepouts interrupt a significant portion of the routing area for dense high speed boards.

Referring now to FIGS. 2-4, there is shown a system 200 having a heat spreader 205 at least on certain critical circuitry to mitigate the above-identified conflict. Heat spreader 205 generally includes a copper or aluminum plate 205 permanently laminated to back 125 of PCB 120. Plate 205 has two primary functions. First, plate 205 tends to spread out the contact pressure near a screw 400 to a wider area because its greater stiffness than PCB 120. Second, if the thermal contact is poor at one location, plate 205 carries heat sideways to a location of better thermal contact. Since PCB 120 is laminated to the heat spreader 205 under pressure, there is provided a very good thermal and mechanical bond.

Referring now to FIGS. 1-4, heat leaving package 110 is generally carried downward through a series of vias 145. This increases the local effective thermal conductivity. Looking at FIGS. 2-4, heat may easily transfer into heat spreader 205 due to this interface between PCB 120 and heat spreader 205. Heat may be conducted sideways through heat spreader 205 with little resistance due to its metallic nature. Heat flow generally occurs in this manner until a region of contact with sufficient pressure is encountered, such as the region near screw 400, where a thermal path is created for heat to enter waterblock 130. In addition to vias 145, heat transfer from package 110 may be carried through a thermal slug 150 attached to package 110, and through solder 155 between thermal slug 150 and PCB 120.

Although the use of laminated heat spreader 140 is thermally desirable, it may have many disadvantages. Generally, the presence of laminated heat spreader 140 makes PCB 120 almost impossible to troubleshoot or repair. Spreader 140 precludes access to backside 125 of PCB 120, and the thermal mass of spreader 140 may interfere with soldering.

SUMMARY OF THE INVENTION

In an embodiment, there is provided a cooling system, comprising a printed circuit board (PCB) having a top surface and a bottom surface, and the PCB forming at least one hole between the top surface and the bottom surface; a heat sink device having a top surface for disposition adjacent the bottom surface of the PCB, and the heat sink having an attachment component for securing the PCB thereto; at least one wiffle tree component having a base portion with a plurality of legs extending therefrom, and the base forming a passageway therethrough; and at least one fastener component extending through the passageway of the at least one wiffle tree, and through the at least one hole of the PCB, and securing the fastener component to the heat sink.

In another embodiment, there is provided a wiffle tree component, comprising a base portion with a plurality of legs extending therefrom, each of the legs having a length, and the base portion forming a passageway therethrough; and a fastener having a diameter sized for passage through the passageway of the base, and having a length; wherein the plurality of legs extend for placement against a plurality of touch down locations on a top surface of a printed circuit board (PCB); wherein the length of the fastener extends through the base portion, through the printed circuit board within a hole defined therein, and attaches to the heat sink; and wherein the length of the plurality of the legs and the length of the fastener are sized to generate pressure at the touch down locations on the top surface of PCB, and the pressure at the touch down locations generates a desired pressure distribution at an interface between the PCB and the heat sink In still another embodiment, there is provided a method of attaching a printed circuit board (PCB) to a heat sink, the method comprising providing at least one wiffle tree component having a base portion with a plurality of legs extending therefrom, and the base forming a passageway therethrough; disposing one of the at least one wiffle tree component adjacent to the PCB, wherein the PCB has at least one hole therethrough, and wherein corresponding ones of the passageway through the one of the at least one wiffle tree component and the hole through the PCB allow attachment of the at least one wiffle tree component and the PCB to the heat sink with a fastener; and securing the one of the at least one wiffle tree component with the fastener, wherein the plurality of legs of the at least one wiffle tree component apply pressure at a plurality of locations on one side of the PCB, and wherein the pressure applied at the plurality of locations on the one side of the PCB creates a desired pressure distribution at an interface of the other side of the PCB and the heat sink.

Other embodiments are also disclosed.

BRIEF DESCRIPTION OF THE DRAWINGS

Illustrative embodiments of the invention are illustrated in the drawings, in which.

DETAILED DESCRIPTION OF AN EMBODIMENT

Figure 5:
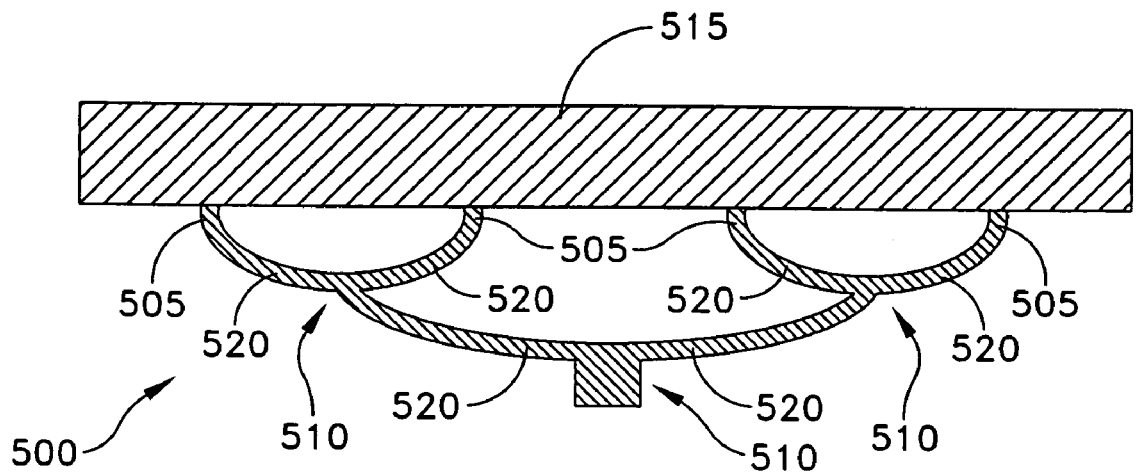
FIG. 5 illustrates a wiffle tree structure used in a windshield wiper.
Figure 6:
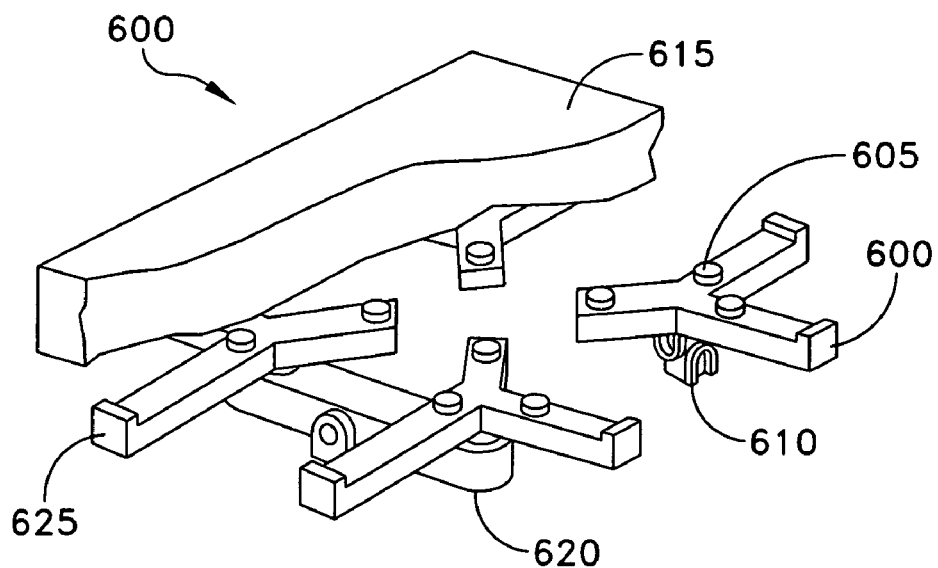
FIG. 6 illustrates a wiffle tree structure supporting a plate.
Figure 7:
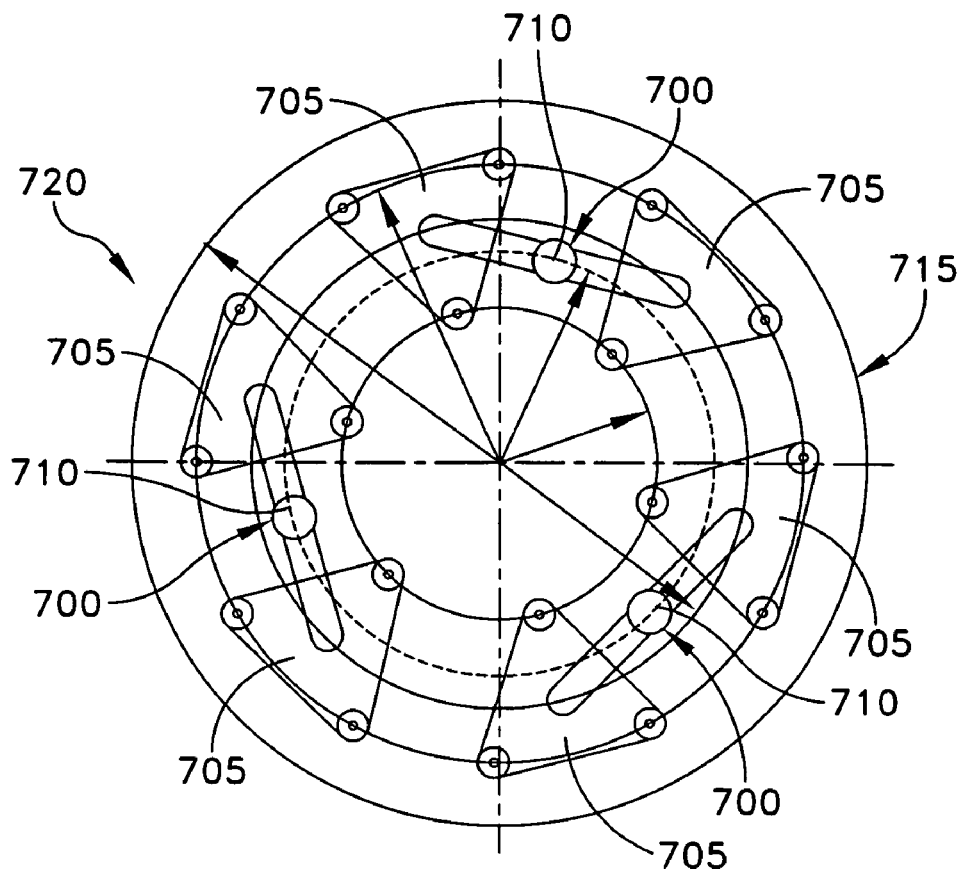
FIG. 7 illustrates a wiffle tree structure supporting a reflecting telescope mirror with three sets of two mounts.

Referring now to FIGS. 5-7, there are shown wiffle tree structures 500, 600 and 700, which provide rigid mounts with areas allowing small amounts of precision deflections.

Looking at FIG. 5, mounts or contact points 505 are joined together with pivot points 510 in wiffle tree structure 500. Wiffle tree structure 500 provides nearly uniform pressure despite such factors a windshield curvature. When providing support to a member 515, such as a wiper blade 515, it is not desirable to over or under constrain supported member 515. This is generally termed 'kinematic' mounting. There are many subtle points to such mounting. Since two points define a line, a linear object may be supported at two points. Furthermore, since three points define a plane, a planar object may be supported securely at three points. Next, uniform pressure needs to be created. Although applying uniform pressure is impossible with a traditional mechanical system, a plurality of pressure points may be configured for exerting an overall uniform force on a structure. This may be accomplished by using wiffle tree 500. Each part of wiffle tree 500 is an arm 520 or a leg 520 that pivots and exerts a force at two (2) or three (3) points. The combination of many nested sets of these arms 520 or legs 520 provide a uniformly loaded structure.

Wiffle tree structures are often used in optics. Looking at FIGS. 6 and 7, there is shown pivot structures 610/710 on each kinematic mount 600/700 to insure equal loading of legs of each wiffle tree 600/700. Wiffle tree mounts 600/700 may be used for accurate suspension of a surface plate 605 (see FIG. 6) and a telescope mirror 705 (see FIG. 7). A mount for a planar object is usually done in this fashion. Each wiffle tree 600/700 is in a triangular configuration, and contacts plate 605 or mirror 705 in only 3 points. Each wiffle tree 600/700 is mounted on a flexure 610/710.

Looking at FIG. 6, wiffle tree structure 600 may include a universal joint (usually a ball joint). Wiffle trees 600 are in turn supported by a balance beam structure 620, which pivots on one axis. The entire surface plate 615 rests on two of these structures. The reason for a balance beam 620 pivot tying two trees 600 together (instead of groupings of three) is to prevent rotation of plate 615 as this is not usually desired.

Referring to FIG. 7, there is shown a standard 18-point mount 720 to mount a large telescope mirror 715 on. (see FIG. 7). Wiffle tree structure 700 may include mounts or contact points 705 joined together with flexures 710 such that mirror 715 experiences no local deflections due to its weight. Although deflection will occur due to applied force or weight, a uniform deflection occurs over the entire supported structure.

Figure 8:
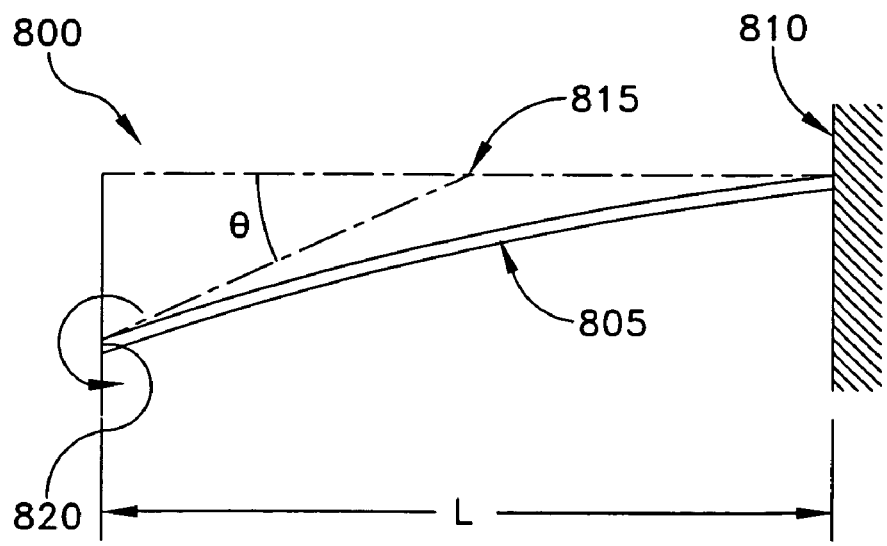
FIG. 8 illustrates a beam structure within a flexure mount subjected to a load on the left side to cause a deflection having small angle of displacement.

Referring to FIG. 8, there is shown a schematic diagram of flexure joint 800 of a beam 805 in attachment to an anchor structure 810, with the action of flexure pivot 800, along its equivalent center of rotation 815. Optical devices, such as beam 805, often need to have small angular deflections as measured from center of rotation 810 with a deflection to location 810 for adjustment purposes. However, mounting assemblies, such as beam 805, on hinges to accomplish this is usually not possible. Even the best made hinge joint generally has much to much play and will move in untended directions as the fit of parts is too loose. If fit is very tight to eliminate this effect, the joint will simply not function. Flexure joints have been used in optics for many years. Instead of having pivots, members are just connected by a thin bridge 805 of material. This metal bridge 805 is allowed to flex under load, so it acts as a pivot. However, it does not have the problem of excess play. Motion may be in two axes or one axis, by having the bridge be circular or a planar in cross section, respectively.

Figure 9:
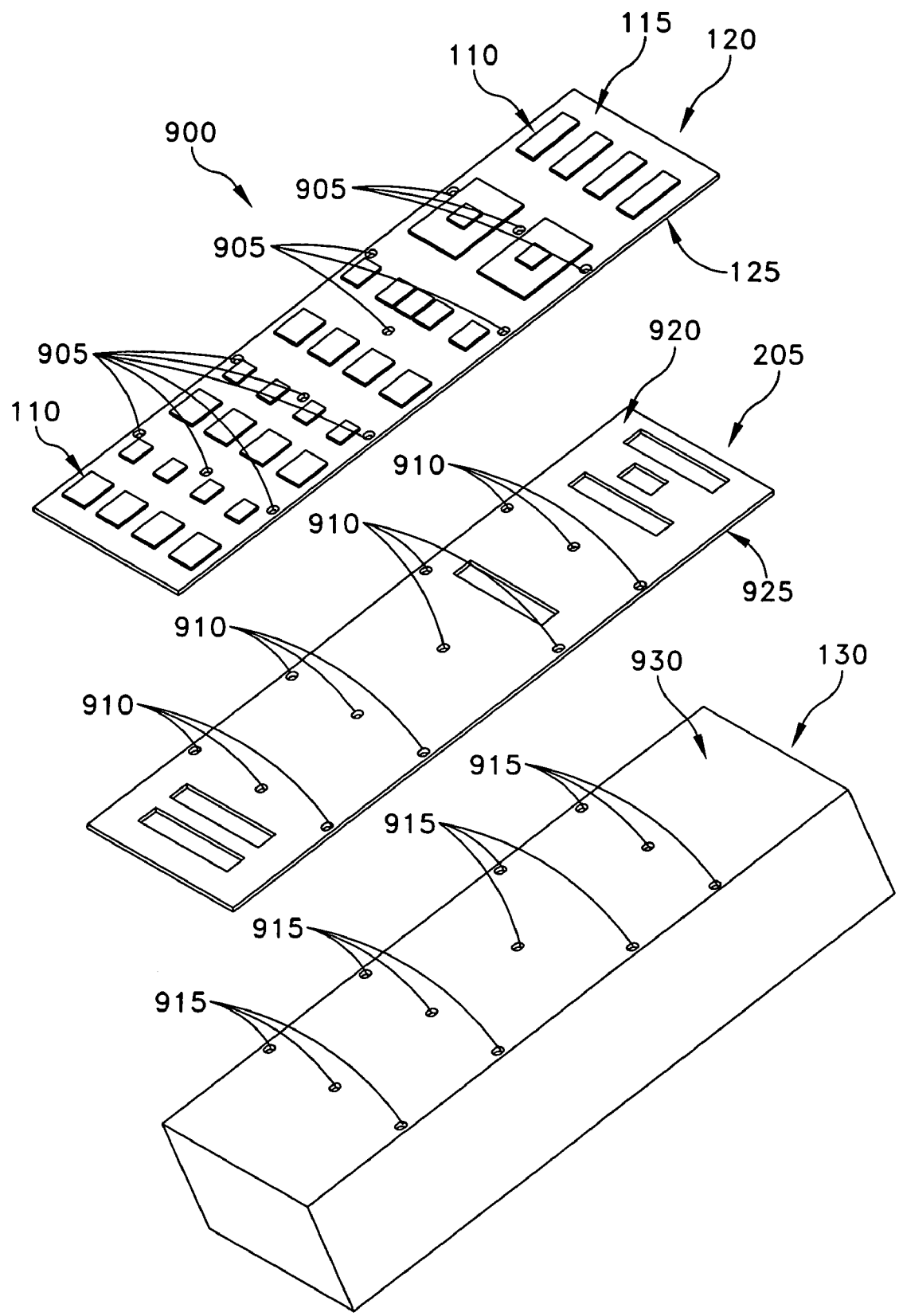
FIG. 9 illustrates a printed circuit board with screw holes therethrough, a heat spreader with screw holes therethrough, and a heat sink with screw holes therein.

Referring to FIG. 9, printed circuit board 120 utilizes heat spreader 205. Looking at FIG. 9, a pattern of screw passages 905, 910 through PCB 120 and heat spreader 205, and into threaded bores 915 within heat sink 130.

Screws (not shown) extend through passages 905 of PCB 120, passages 910 of heat spreader 205, and threadably engage within bores 915 of heat sink device 130. These screws may be tightened to maximize contact pressure between bottom surface 125 of PCB 120 and a top surface 920 of heat spreader 205, and between a bottom surface 925 of heat spreader 205 and a top surface 930 of heat sink device 130.

Contact pressure may be analyzed using commercially available film that measures the contact pressure between two objects. For example, such film is often used to design gaskets.

Figure 10:
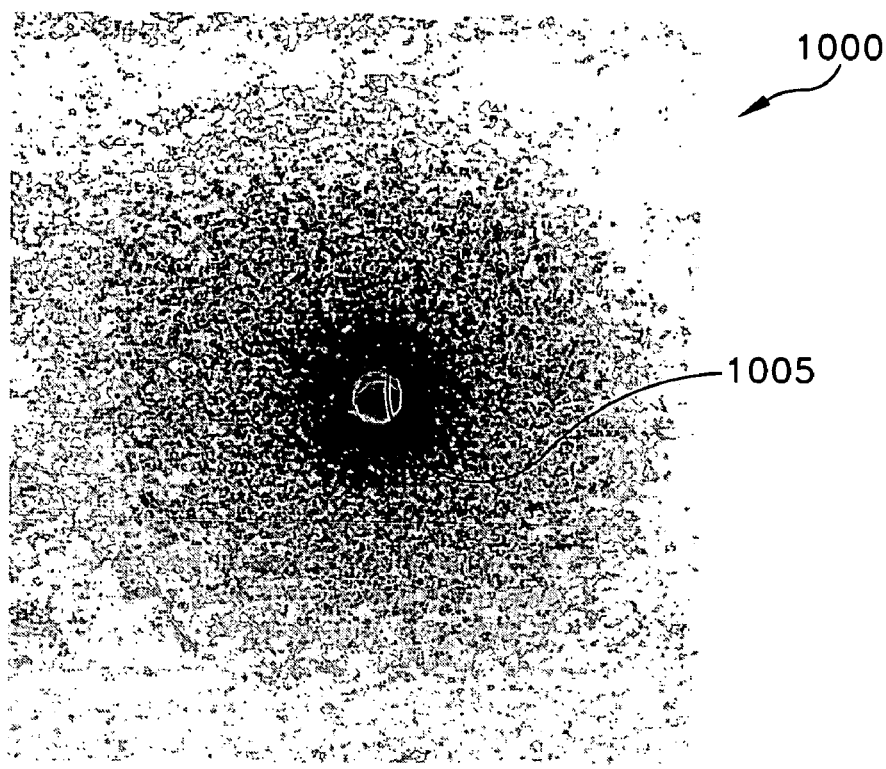
FIG. 10 illustrates a measured pressure distribution over an area surrounding the attachment site adjacent to one of the screw holes of the PCB and the heat spreader and the heat sink of FIG. 9.

Looking at FIG. 10, there is shown an image 1000 of pressure distribution around a single screw passageway 1005 corresponding to one of passageways 905 and passageways 910 in PCB 120 and heat sink 130, respectively.

Figure 11:
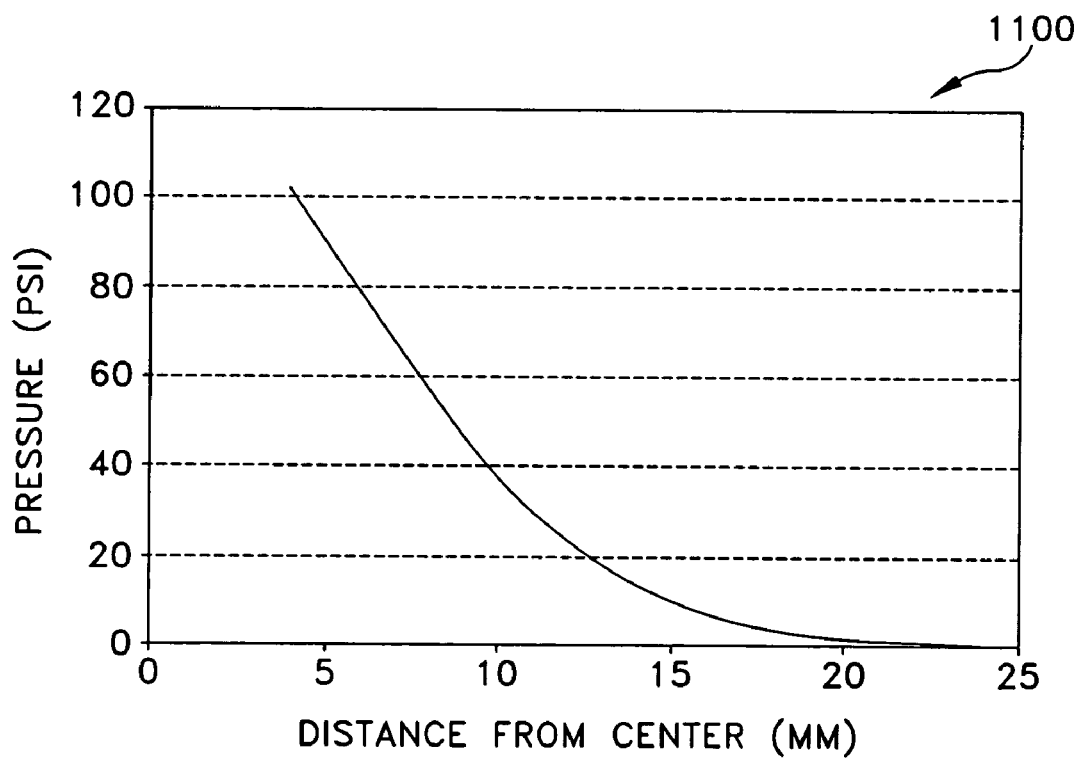
FIG. 11 illustrates a graphical representation of the applied pressure (as shown in FIG. 10) to the area surrounding the passageway of the single screw through the PCB, where the magnitude of the applied pressure is a function of distance from the passageway.

FIG. 11 illustrates a graph 1100 of pressure data corresponding to the pressure imaging of FIG. 10. Note the there is a rapid decrease in pressure with increasing radial distance from passageway 1005. Pressures of twenty (20) PSI or less do not effectively compress most thermal interface materials, some of which are really designed to work at pressures in excess of fifty (50) PSI. Twenty (20) PSI is reached within a radial distance of 12 mm from the center of the screw and passageway 1005. Generally, this necessitates heat spreader 205 to permit efficient sideways conduction of heat to an area of adequate contact with heat sink 130.

Figure 1:
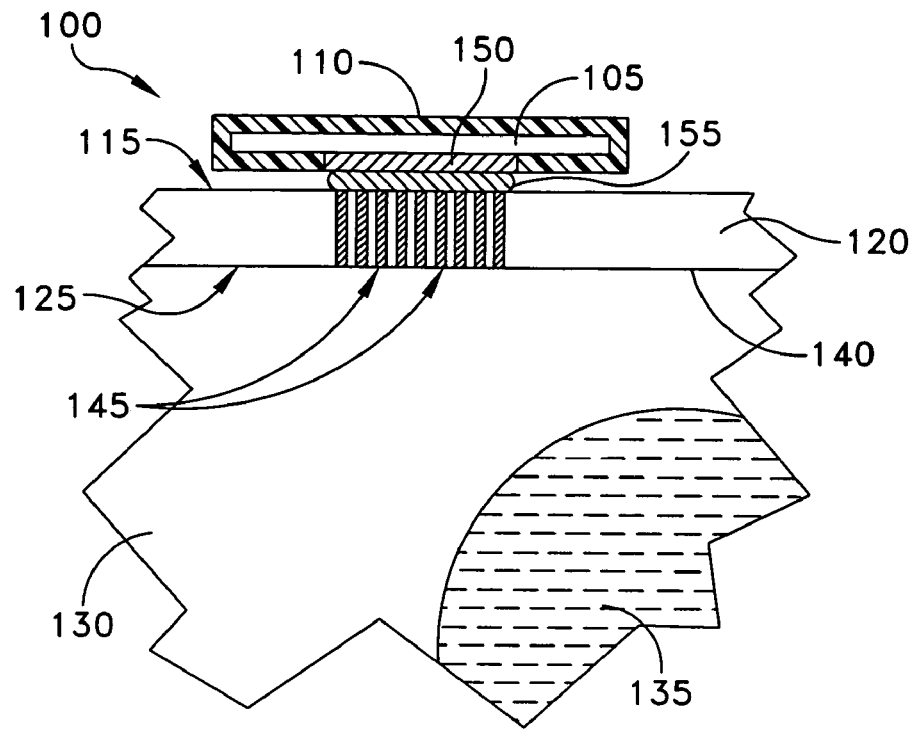
FIG. 1 illustrates a PCB without a heat spreader.
Figure 2:
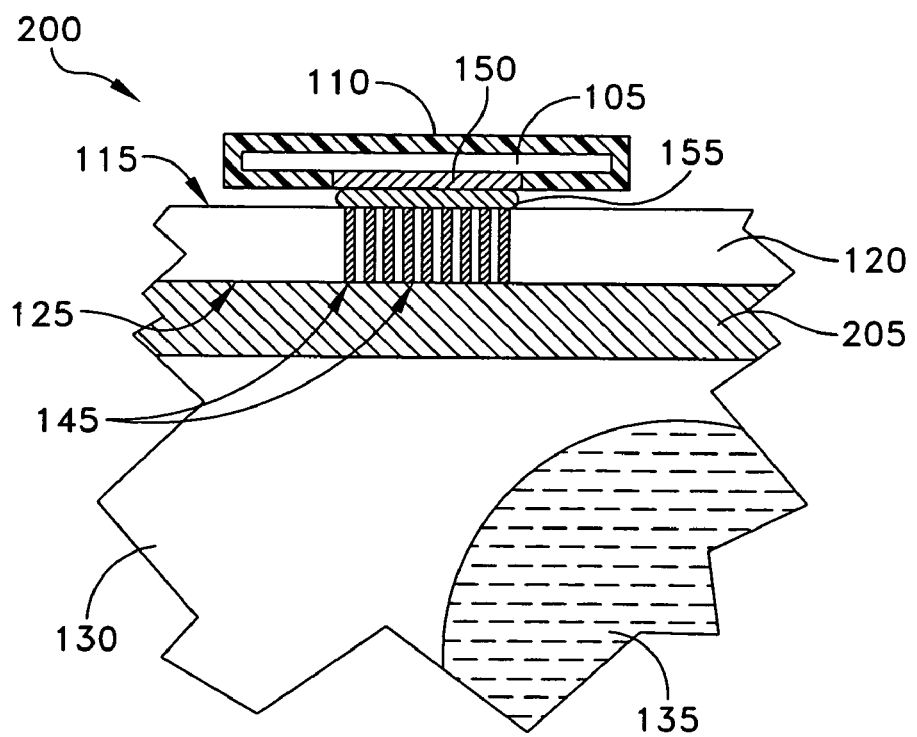
FIG. 2 illustrates a heat spreader construction.
Figure 3:
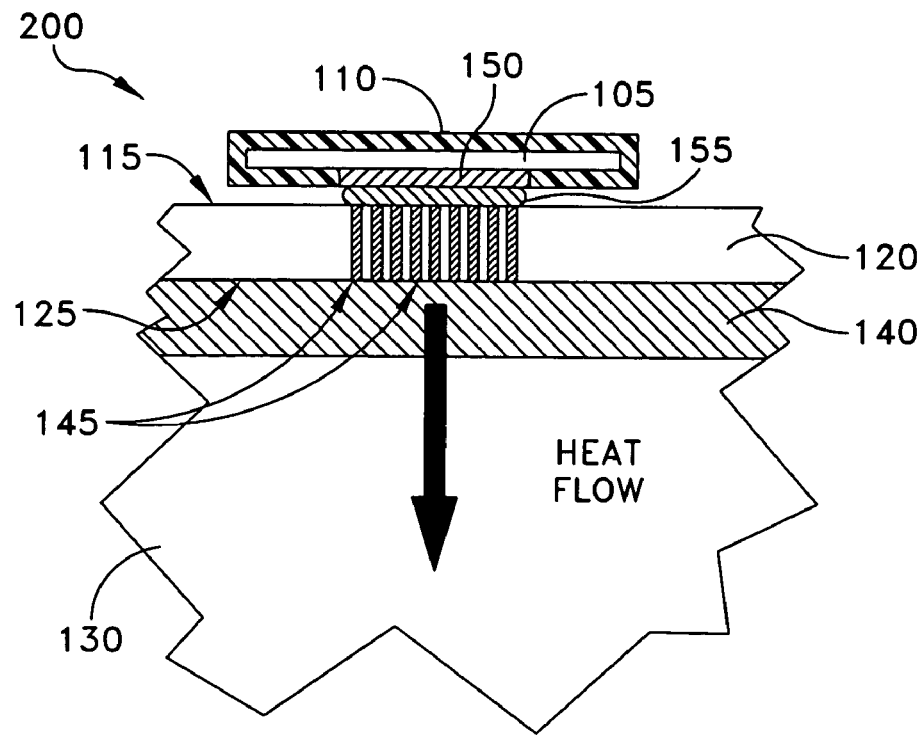
FIG. 3 illustrates an exemplary embodiment of heat transport with good thermal contact under device.
Figure 4:
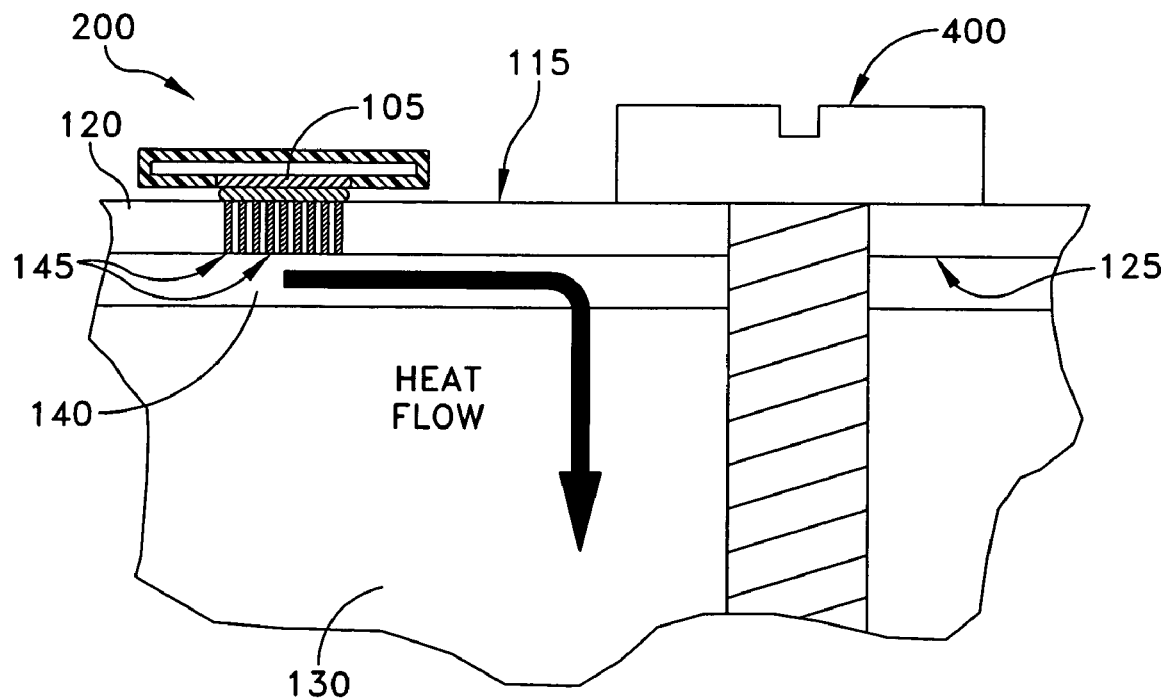
FIG. 4 illustrates heat transport with poor thermal contact under device.

Generally, and as discussed above, it is desirable to provide an even (or at least tailored) pressure distribution between a PCB and a heat sink. The resulting increase in local pressure over most areas or most critical areas of the PCB allows the elimination of the laminated heat spreader 205 (see FIG. 2). This lowers cost, and increases yield and serviceability of the PCB. By the proper utilization of wiffle tree devices, the contact pressure at critical points of PCB, such as high dissipating circuit, may be greatly increased without the use of additional screws.

Figure 12:
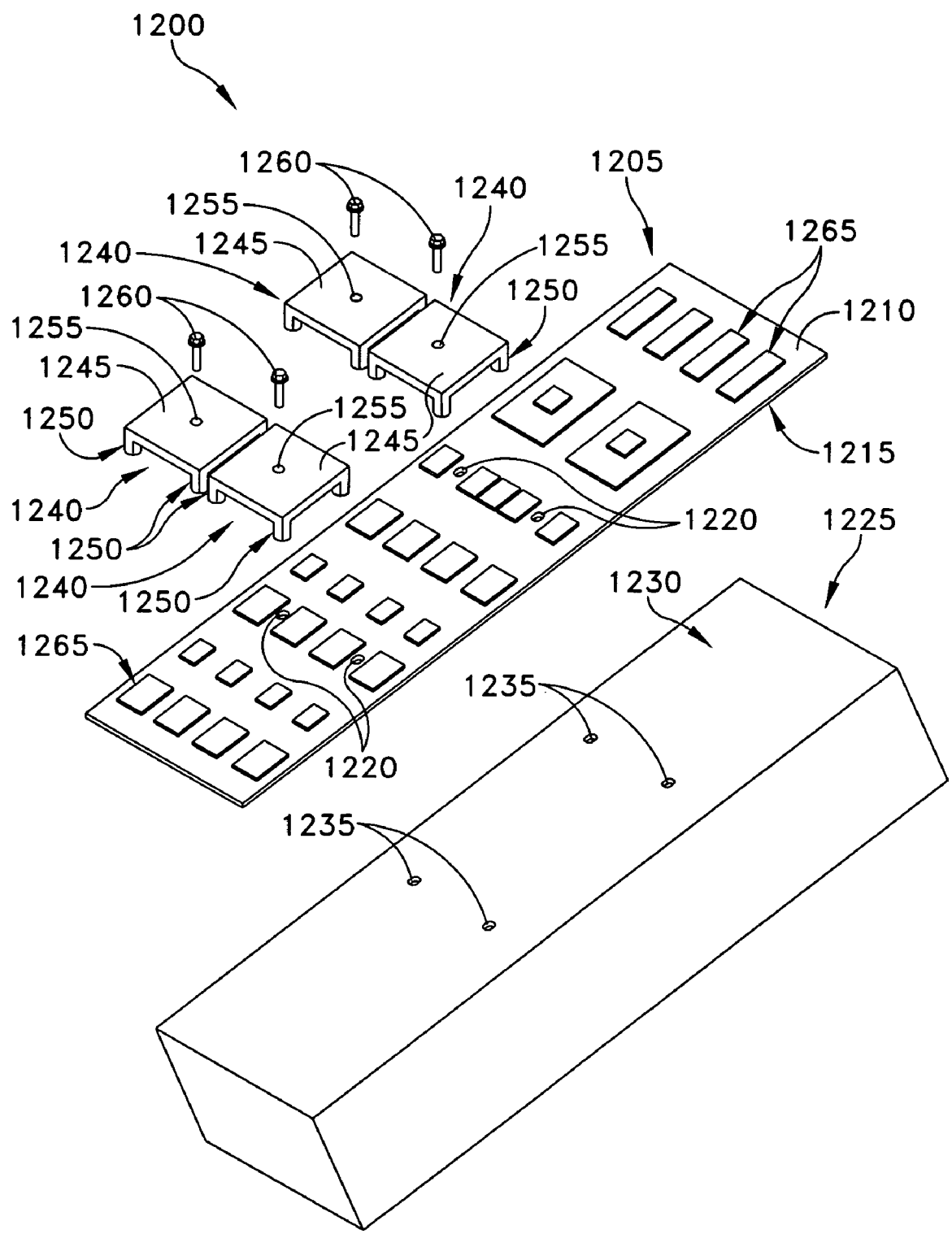
FIG. 12 illustrates an exploded view of a novel cooling system having four screws, four wiffle trees each having a central portion with a passageway therethrough and four legs, a PCB having four passageways therethrough, and a heat sink having four holes therein, and in an embodiment, the cooling system is attached together with the four screws each passing through one of the passageways in the wiffle trees, through the passageways of the PCB, and in threadable engagement with the heat sink, and the four legs of each of the wiffle trees applying pressure to the PCB.
Figure 15:
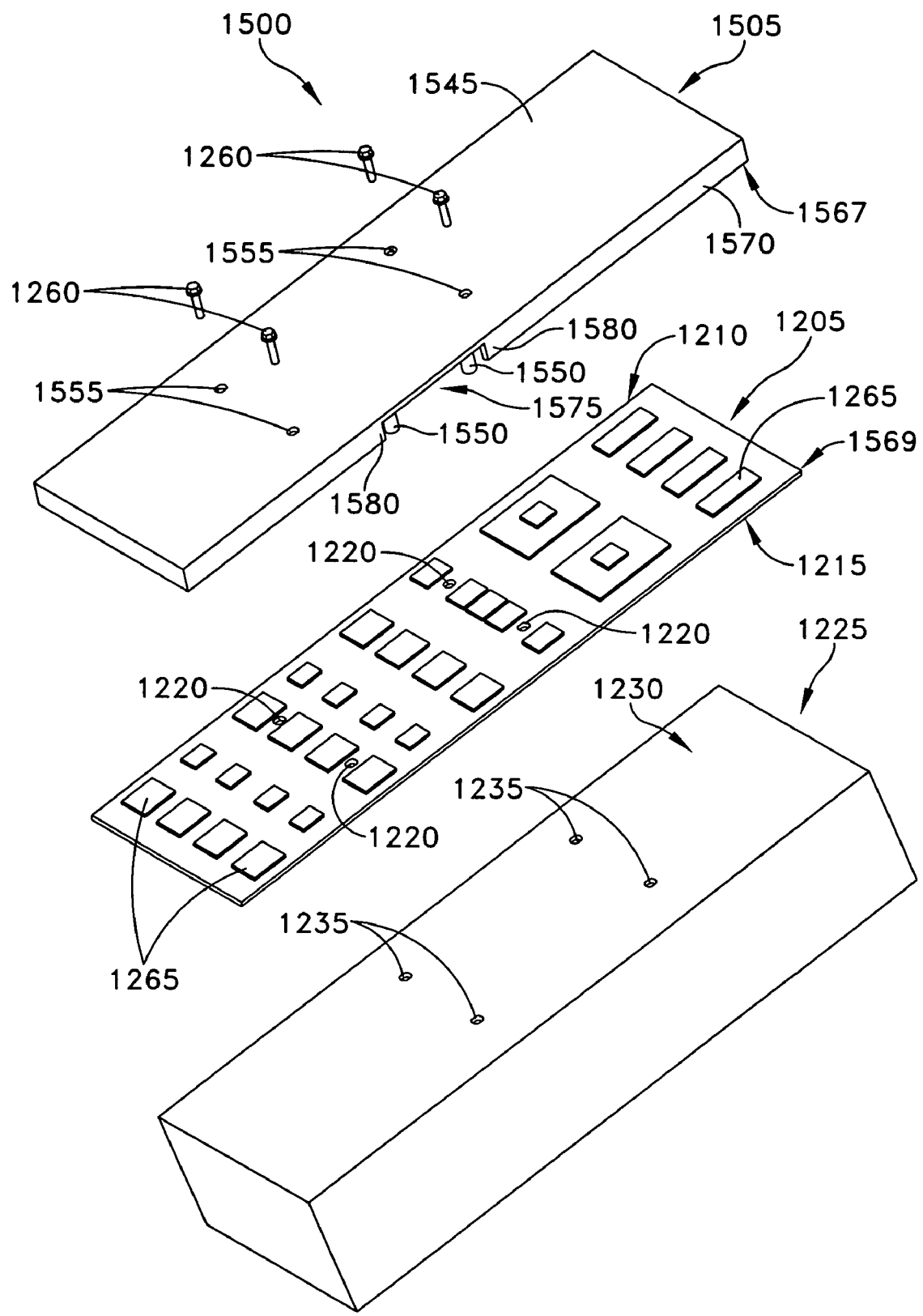
FIG. 15 illustrates a heat sink, a PCB, and an outer surface of a PCB cover having the wiffle trees shown in FIG. 12 integrated therein.

Looking at FIGS. 12 and 15, there is shown apparatus 1200 (FIG. 12) and apparatus 1500 (FIG. 15). In an embodiment, apparatus 1200 or apparatus 1500 may include a printed circuit board 1205, which is also referred to as PCB 1205. PCB 1205 may have a top surface 1210 and a bottom surface 1215. Apparatus 1200 or apparatus 1500 may include a heat sink device 1225 having a top surface 1230 for disposition adjacent bottom surface 1215 of PCB 1205.

Apparatus 1200 or apparatus 1500 may include at least one wiffle tree component 1240 disposed adjacent top surface 1210 of PCB 1205. Wiffle tree component 1240 may have a base portion 1245 with a plurality of legs 1250 extending therefrom. PCB 1205 may include a plurality of touch down areas for receiving pressure from plurality of legs 1250.

In one embodiment, there may be provided at least one mechanism 1260, which may include but is not limited to one or more screws, to generate a clamping force between the at least one wiffle tree 1240 and top surface 1230 of PCB 1205, and between bottom surface 1210 of PCB 1205 and heat sink 1225.

In an embodiment, apparatus 1200 may form a portion of a cooling system (FIG. 12) and apparatus 1500 may form a portion of a cooling system (FIG. 15).

In one embodiment, PCB 1205 may also form at least one hole 1220 between top surface 1210 and bottom surface 1215. An attachment component 1235 may be provided for securing PCB 1205 to heat sink 1225. A passageway 1255 may be formed through base portion 1245 of one or more of wiffle tree components 1240. At least one fastener component 1260 may be provided for disposition through the passageway 1255 of the at least one wiffle tree 1240, and through the at least one hole 1220 of the PCB 1205. One or more fastener components 1260 may also be included for securing the fastener component 1260 to heat sink 1225.

In an embodiment, wiffle tree 1240 may provide pressure distribution with fastener 1260 as a single screw 1260 at the center of base 1245 and four contact points with legs 1250. In one embodiment, single screw 1260 is a 3 mm screw.

Figure 13:
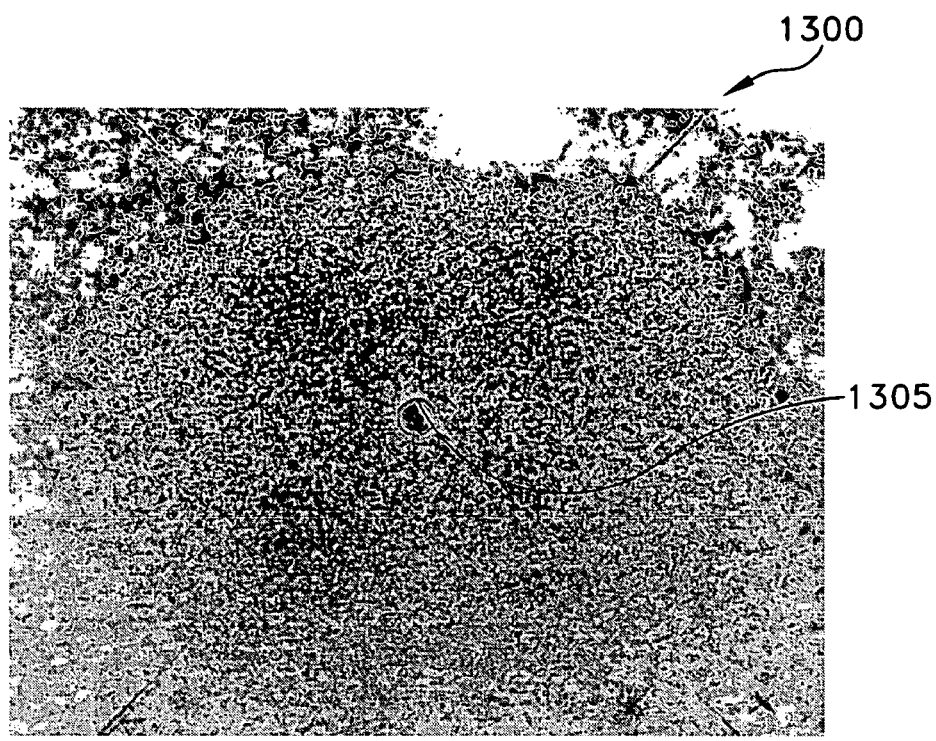
FIG. 13 illustrates a measured pressure distribution over an area surrounding the passageway through the PCB which is the attachment for a single four point wiffle tree.

Looking at FIG. 13, there is shown an image 1300 of pressure distribution around a passageway 1305 corresponding to one of passageways 1220 and 1235 in PCB 1205 and heat sink 1225, respectively.

Figure 14:
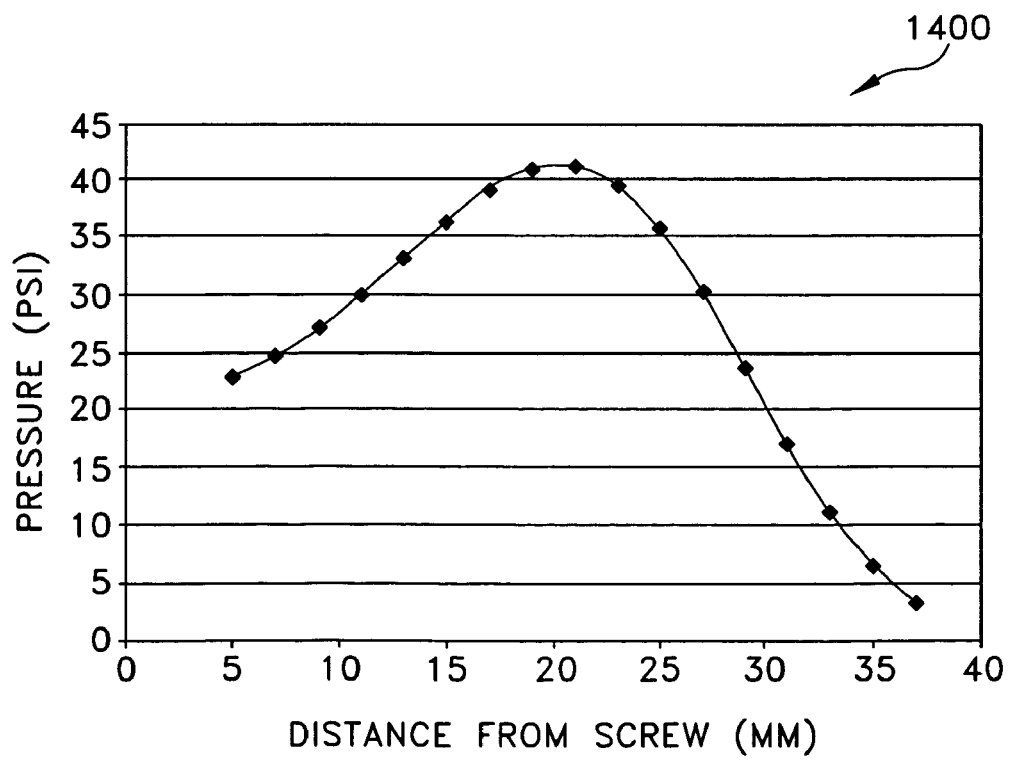
FIG. 14 illustrates a graphical representation of the applied pressure (as shown in FIG. 13) to the area surrounding the passageway through the PCB, where the magnitude of the applied pressure is a function of the distance form the passageway.

FIG. 14 illustrates a graph 1400 of pressure data corresponding to the pressure imaging of FIG. 13. Compared to the pressure data shown in graph 1100 with a diameter of 12 mm, a region having a contact pressure of greater than 20 PSI may be increased to a diameter of about 30 mm. This is an increase in area of over 500%. Wiffle tree 1240 spreads the area of useable contact pressure while simultaneously decreasing the number of through holes 1220 in board 1205. The increased uniformity of contact pressure allows elimination of the heat spreader.

In an embodiment, plurality of legs 1250 of the at least one wiffle tree component 1240 may apply pressure at a plurality of locations on the top surface of the PCB 1205. The pressure applied at the plurality of locations on top surface 1210 of PCB 1205 may create a desired pressure distribution at an interface of bottom surface 1215 of PCB 1205 and top surface 1230 of heat sink 1225.

In one embodiment, base portion 1245 of wiffle tree component 1240 may flex under the pressure generated by fastener component 1260 secured to heat sink 1225. Each one of the legs 1250 of wiffle tree component 1240 may generate a substantially uniform pressure against the PCB 1205 due to the flexure of base portion 1245.

By making base 1245 with a flexible construction, even contact force may be achieved at all 4 points of contact of legs 1250, provided the surface 1210 of PCB 1205 is roughly planar. Although there are many more objects contacting top surface 1210, such as wiffle tree legs 1250, this is not of great significance inasmuch as the internal layers of board 1205 may still be used for routing signals. Each additional screw hole through board 1205 has much greater impact, since all the internal layers are interrupted.

PCB 1205 may be configured to provide a plurality of touch down areas for receiving pressure from the plurality of legs 1250. Generally, wiffle tree component 1240 includes four legs 1250. These four legs 1250 may be arranged to touch down on the PCB 1205 in a grid configuration.

PCB 1205 may have four touch down areas surrounding the at least one hole 1220 for receiving pressure from the four legs 1250 of wiffle tree component 1240. The four touch down areas may be disposed between packages 1265 arranged in a grid configuration on the PCB 1205.

Referring now to FIG. 15, and in an embodiment, there may be provided at least one wiffle tree component 1240 integrally provided in a cover 1505. Typically, cover 1505 may locate the plurality of legs 1250 extending from the at least one wiffle tree 1240 to touch down areas on the PCB 1205. Cover 1505 may flex under pressure generated by the fastener component 1260 secured to heat sink 1225.

Furthermore, cover 1050 may limit rotation and movement of the plurality of legs 1250 extending from the at least one wiffle tree 1240 so as to prevent damage to PCB 1205 and packages 1265 mounted on PCB 1205. Cover 1505 may also provide protection to PCB 1205 from other sources of mechanical damage.

In addition, the use of a flexure mount can tie these separate wiffle trees together into an easily handled and assembled structure. In one embodiment, a relatively thin bridge of material between the wiffle trees, such that each one is free to flex slightly, and each one acts independently around its four points of contact.

Optionally, cover 1505 may have a periphery 1567 sized to substantially match a periphery 1569 of the PCB 1205. Cover 1505 may include a lip 1570 surrounding at least a portion of periphery 1567. Lip 1570 may be configured to provide cover 1505 with a certain degree of flexibility. Lip 1570 of periphery 1567 may include edge at least one opening 1575 defined by edge portions 1580. In one embodiment, opening 1575 may provide increased flexibility of cover 1505.

Figure 16:
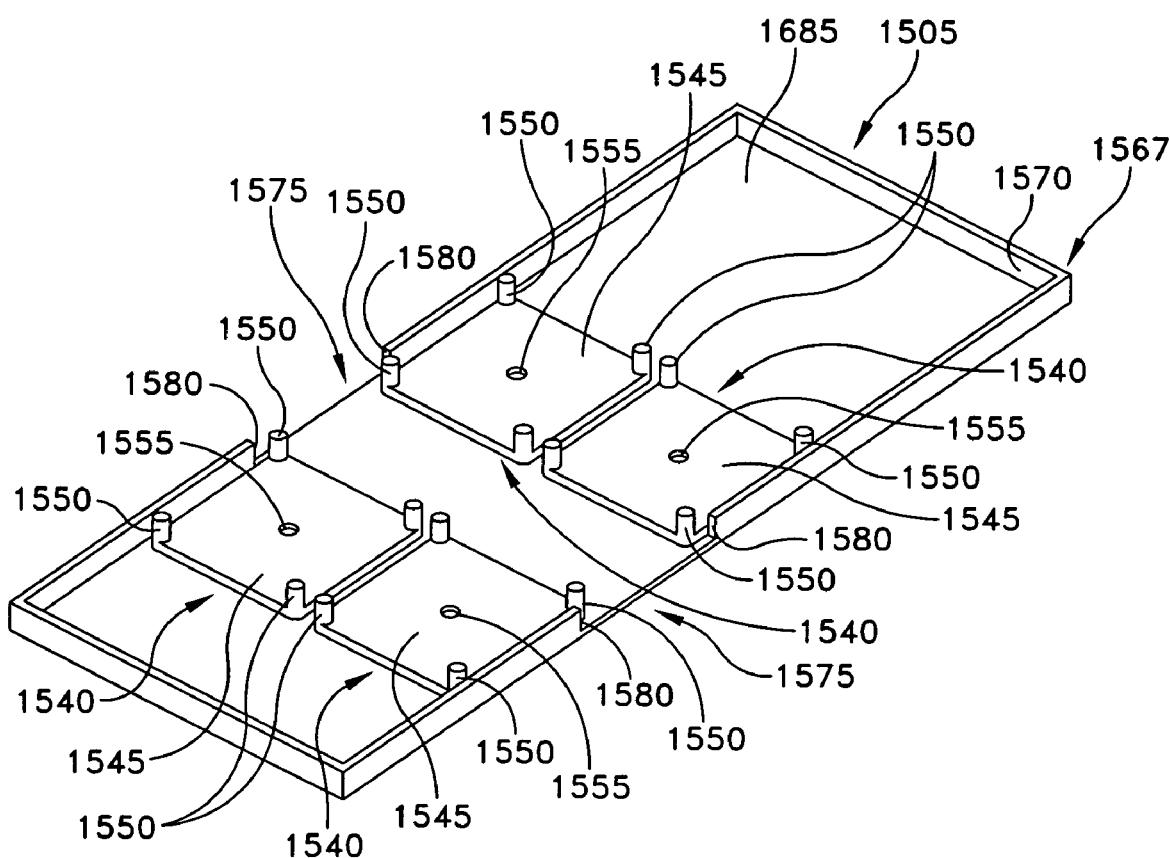
FIG. 16 illustrates an inner surface of the PCB cover as shown in FIG. 15.

As best illustrated in FIGS. 12, 15 and 16, and in an embodiment, plurality of legs 1250 may each extend an equal distance from the base 1245 portion.

Referring now to FIGS. 12 and 15, and in one embodiment, heat sink 1225 may include a water cooled component 1225. For example, water cooled component 1225 may be a waterblock 1225. In another embodiment, heat sink 1225 may include an air cooled component 1225.

Generally, attachment component 1235 of heat sink 1225 includes one or more bores 1235 within the heat sink 1225. Each one of bores 1235 may include a set of screw threads. These threads may be sized for engagement with fastener component 1260.

Referring still to FIGS. 12 and 15, and in an embodiment, PCB 1205 may include packages 1265 disposed on top surface 1210. PCB 1205 may include traces (not shown) disposed in layers (not shown) between top surface 1210 and bottom surface 1215.

Packages 1265 may be arranged in a grid arrangement. Touch down locations for the plurality of legs 1250 extending from wiffle tree component 1240 may be disposed between ones of packages 1265. Typically, at least one of packages 1265 may be disposed between the touch down locations of wiffle tree component 1240 and at least one hole 1220 through PCB 1205. In an embodiment, at least one of the traces is disposed in one of the layers under one of the touch down locations of PCB 1205.

Looking at FIGS. 12 and 15, and in an embodiment, fastener component 1260 may include at least one screw 1260. Typically, there is provided screw threads on screw 1260 sized for engagement with bores 1235.

Typically, bottom surface 1215 of PCB 1205 and top surface 1230 of heat sink 1225 interface directly with one another. This permits heat transfer directly from PCB 1205 to heat sink 1225.

In one embodiment, fastener 1260 may have a diameter sized for passage through passageway 1255 of base 1245. Fastener 1260 may have a length sized for engagement with attachment portions 1235 of heat sink 1225 when the legs 1250 are placed against touch down locations on top surface 1210 of PCB 1205, and fastener 1260 is extending through base portion 1245, through PCB 1205. In turn, legs 1250 generate pressure at the touch down locations on top surface 1230 of PCB 1205, and this pressure at the touch down locations generates a desired pressure distribution at an interface between PCB 1205 and heat sink 1225.

Figure 17:
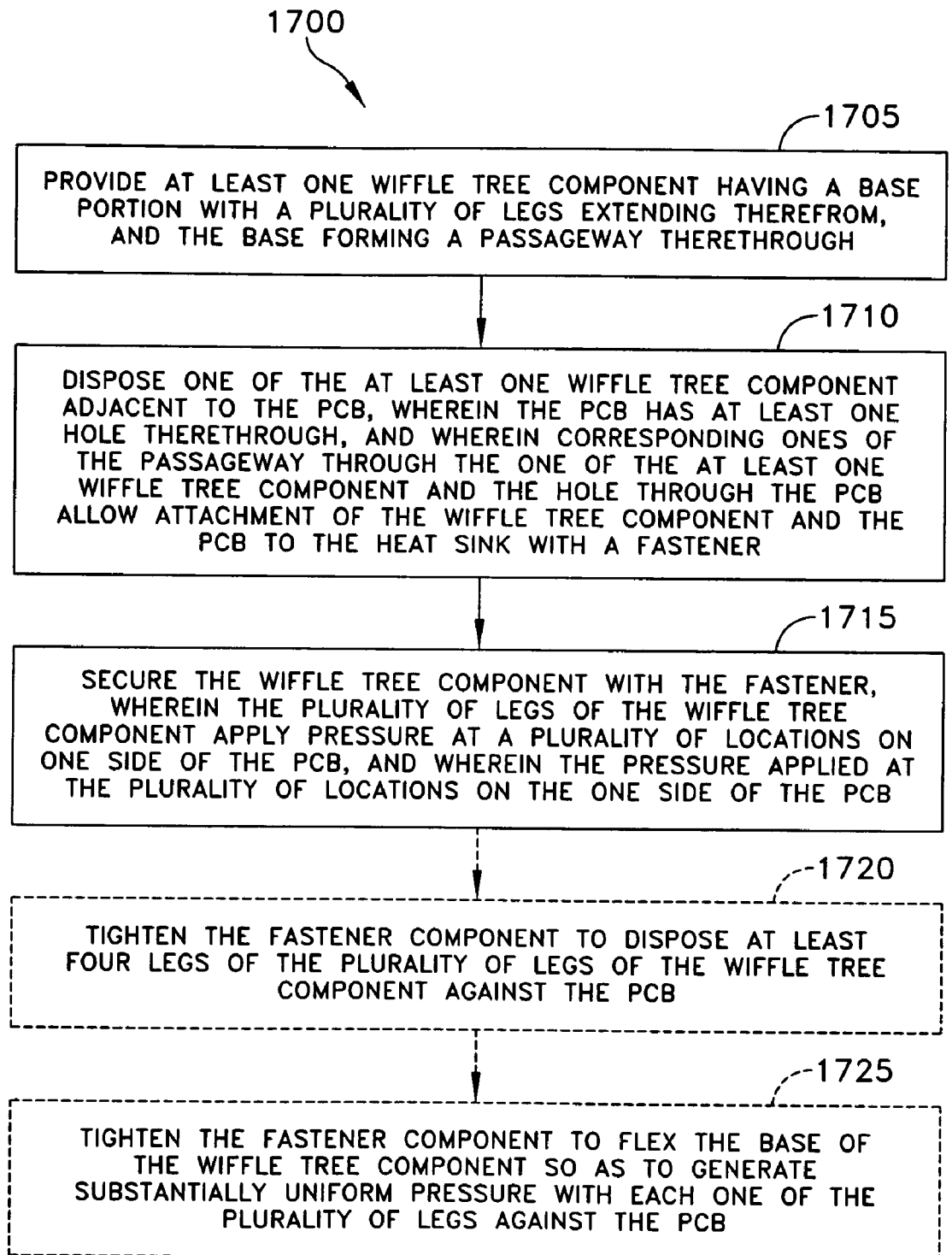
FIG. 17 illustrates one exemplary method of attaching a PCB and a heat sink to one another.

Referring now to FIG. 17, and in one embodiment, there is shown a method 1700 of attaching a printed circuit board (PCB) to a heat sink. Method 1700 may include providing 1705 at least one wiffle tree component having a base portion with a plurality of legs extending therefrom, and the base forming a passageway therethrough. Method 1700 may further include disposing 1710 one of the at least one wiffle tree component adjacent to the PCB, wherein the PCB has at least one hole therethrough, and wherein corresponding ones of the passageway through the one of the at least one wiffle tree component and the hole through the PCB allow attachment of the at least one wiffle tree component and the PCB to the heat sink with a fastener. Method 1700 may include 1715 securing the one of the at least one wiffle tree component with the fastener, wherein the plurality of legs of the at least one wiffle tree component apply pressure at a plurality of locations on one side of the PCB, and wherein the pressure applied at the plurality of locations on the one side of the PCB creates a desired pressure distribution at an interface of the other side of the PCB and the heat sink.

Disposing 1710 the one of the at least one wiffle tree component adjacent to the PCB may include placing the fastener component through the passageway of the wiffle tree component and the hole through the PCB, and attaching the fastener component to the heat sink. Attaching the fastener component to the heat sink may include engaging screw threads on the fastener component with screw threads formed on a bore within the heat sink. Attaching the fastener component to the heat sink may further include tightening the fastener component to dispose at least three legs of the plurality of legs of the wiffle tree component against the PCB. Attaching the fastener component to the heat sink may further include tightening the fastener component to dispose at least four legs of the plurality of legs of wiffle tree against the PCB.

Method 1700 may further include aligning the at least four legs of the plurality of the wiffle tree component with touch down areas disposed on the PCB prior to tightening the fastener component. Method 1700 may further include tightening 1725 the fastener component to flex the base of the wiffle tree component so as to generate substantially uniform pressure with each one of the plurality of legs against the PCB.

In another embodiment, method 1700 may include disposing a second one of the at least one wiffle tree component adjacent to the PCB, wherein the PCB has at least one hole therethrough, and wherein corresponding ones of the passageway through the one of the at least one wiffle tree component and the hole through the PCB allow attachment of the second one of the at least one wiffle tree component and the PCB to the heat sink with a fastener. The method may include securing the second one of the at least one wiffle tree component with the fastener, wherein the plurality of legs of the second one of the at least one wiffle tree component apply pressure at a plurality of locations on one side of the PCB, and wherein the pressure applied at the plurality of locations on the one side of the PCB.

In one embodiment, method 1700 may include providing the at least one wiffle tree component having a cover. One or more wiffle tree component may be integrally provided in the cover.

What is claimed is:

1. Apparatus, comprising:
    a printed circuit board (PCB) having a top surface and a bottom surface;
    a heat sink device having a top surface for disposition adjacent the bottom surface of the PCB;
    at least one wiffle tree component disposed adjacent the top surface of the PCB, having a base portion with our legs extending therefrom, the four legs arranged in a grid configuration, wherein the PCB has our touch down areas for receiving pressure from the our legs; and
    at least one mechanism to generate a clamping force between the at least one wiffle tree and the top surface of the PCB, and between the bottom surface of the PCB and the heat sink.

2. Apparatus in accordance with claim 1, wherein the PCB forms at least one hole between the top surface and the bottom surface, wherein the base forms a passageway therethrough, and wherein the at least one mechanism comprises at least one fastener component extending through the passageway of the at least one wiffle tree, and through the at least one hole of the PCB, and wherein the at least one fastener is in securing attachment to the heat sink.

3. Apparatus in accordance with claim 2, wherein the heat sink has at least one attachment component for securing the at least one fastener thereto.

4. Apparatus in accordance with claim 1, wherein the base portion of the wiffle tree component flexes under pressure generated by the fastener component secured to the heat sink, and wherein each one of the legs of the wiffle tree component generates a substantially uniform pressure against the PCB due to flexure of the base portion.

5. Apparatus in accordance with claim 1, wherein the PCB has four touch down areas surrounding the at least one hole for pressure from the four legs of the wiffle tree component, and wherein the four touch down areas are disposed between packages arranged in a grid configuration on the PCB.

6. Apparatus in accordance with claim 1, further comprising a cover having the at least one wiffle tree component integrally provided therein.

7. Apparatus in accordance with claim 6, wherein the cover locates the plurality of legs extending from the at least one wiffle tree to touch down areas on the PCB.

8. Apparatus in accordance with claim 6, wherein the at least one wiffle tree component is joined to the cover with at least one flexure mount.

9. Apparatus in accordance with claim 8, wherein the at least one flexure mount flexes under pressure generated by the fastener component secured to the heat sink, and wherein each one of the legs of the wiffle tree component generates a substantially uniform pressure against the PCB due to flexure of the flexure mount.

10. Apparatus in accordance with claim 6, wherein the base portion of each of the at least one wiffle tree component is integral with the cover, and wherein the cover flexes under pressure generated by the fastener component secured to the heat sink, and wherein each one of the legs of the wiffle tree component generates a substantially uniform pressure against the PCB due to flexure of the cover.

11. Apparatus in accordance with claim 6, wherein the cover limits rotation and movement of the our legs extending from the at least one wiffle tree so as to prevent damage to the PCB and packages mounted thereon.

12. Apparatus in accordance with claim 11, wherein the cover has a periphery sized to substantially match a periphery of the PCB, and wherein the cover has a lip surrounding at least a portion of the periphery thereof.

13. Apparatus in accordance with claim 12, wherein the lip of the periphery has edge portions defining at least one opening therein, and the at least one opening provides increased flexibility of the cover.

14. Apparatus in accordance with claim 1, wherein the our legs each extend an equal distance from the base portion.

15. Apparatus in accordance with claim 1, wherein the heat sink comprises a water cooled component.

16. Apparatus in accordance with claim 15, wherein the water cooled component is a waterblock.

17. Apparatus in accordance with claim 1, wherein the heat sink comprises an air cooled component.

18. Apparatus in accordance with claim 1, wherein the heat sink forms at least one bore therein, and wherein the at least one fastener is in securing attachment to the heat sink with the at least one bore formed within the heat sink.

19. Apparatus in accordance with claim 18, wherein each one of the at least one bore comprises a set of screw threads therein.

20. Apparatus in accordance with claim 1, wherein the PCB comprises packages disposed on the top surface thereof, and wherein the PCB comprises traces disposed in layers between the top surface and the bottom surface.

21. Apparatus in accordance with claim 1, wherein the bottom surface of the PCB and the top surface of the heat sink interface directly with one another so as to permit heat transfer directly from the PCB to the heat sink.

22. A method of attaching a printed circuit board (PCB) to a heat sink, the method comprising:
    providing at least one wiffle tree component having a base portion with our legs extending therefrom, the four legs arranged in a grid configuration, and the base forming a passageway therethrough;
    disposing one of the at least one wiffle tree component adjacent to the PCB, wherein the PCB has at least one hole therethrough, and wherein corresponding ones of the passageway through the one of the at least one wiffle tree component and the hole through the PCB allow attachment of the at least one wiffle tree component and the PCB to the heat sink with a fastener; and
    securing the one of the at least one wiffle tree component with the fastener, wherein the our legs of the at least one wiffle tree component apply pressure at our locations on one side of the PCB, and wherein the pressure applied at the our locations on the one side of the PCB creates a desired pressure distribution at an interface of the other side of the PCB and the heat sink.

23. A method in accordance with claim 22, further comprising attaching the fastener component to the heat sink, wherein screw threads on the fastener component are engaged with screw threads formed on a bore within the heat sink.

24. A method in accordance with claim 23, wherein attaching the fastener component to the heat sink further comprises tightening the fastener component to flex the base of the wiffle tree component so as to generate substantially uniform pressure with each of the our legs against the PCB.

25. A method in accordance with claim 22, further comprising:

disposing a second one of the at least one wiffle tree component adjacent to the PCB, wherein the PCB has at least one hole therethrough, and wherein corresponding ones of the passageway through the one of the at least one wiffle tree component and the hole through the PCB allow attachment of the second one of the at least one wiffle tree component and the PCB to the heat sink with a fastener; and securing the second one of the at least one wiffle tree component with the fastener, wherein the our legs of the second one of the at least one wiffle tree component apply pressure at our locations on one side of the PCB.

26. A method in accordance with claim 22, wherein providing the at least one wiffle tree component comprises providing a cover having the at least one wiffle tree component integrally provided therein.

\* \* \* \* \*

UNITED STATES PATENT AND TRADEMARK OFFICE
CERTIFICATE OF CORRECTION

PATENT NO. : 7,460,371 B2
APPLICATION NO. : 11/440955
DATED : December 2, 2008
INVENTOR(S) : John William Andberg et al.

It is certified that error appears in the above-identified patent and that said Letters Patent is hereby corrected as shown below:

In column 9, line 29, in Claim 1, delete "our" and insert -- four --, therefor.

In column 9, line 31, in Claim 1, delete "our" and insert -- four --, therefor.

In column 9, line 32, in Claim 1, delete "our" and insert -- four --, therefor.

In column 10, line 15, in Claim 11, delete "our" and insert -- four --, therefor.

In column 10, line 26, in Claim 14, delete "our" and insert -- four --, therefor.

In column 10, line 53, in Claim 22, delete "our" and insert -- four --, therefor.

In column 10, line 64, in Claim 22, delete "our" and insert -- four --, therefor.

In column 10, line 65, in Claim 22, delete "our" and insert -- four --, therefor.

In column 10, line 67, in Claim 22, delete "our" and insert -- four --, therefor.

In column 11, line 11, in Claim 24, delete "our" and insert -- four --, therefor.

In column 12, line 8, in Claim 25, delete "our" and insert -- four --, therefor.

In column 12, line 10, in Claim 25, delete "our" and insert -- four --, therefor.

Signed and Sealed this

Fourteenth Day of April, 2009

JOHN DOLL
*Acting Director of the United States Patent and Trademark Office*